US 6,690,218 B2

(12) United States Patent
Goldblatt

(10) Patent No.: US 6,690,218 B2
(45) Date of Patent: Feb. 10, 2004

(54) METHOD OF PERFORMING DUTY CYCLE CORRECTION

(75) Inventor: Jeremy Goldblatt, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 0 days.

(21) Appl. No.: 10/126,036

(22) Filed: Apr. 18, 2002

(65) Prior Publication Data

US 2003/0197538 A1 Oct. 23, 2003

(51) Int. Cl.[7] ............................................. H03K 5/12
(52) U.S. Cl. ....................................... 327/175; 327/170
(58) Field of Search ................................ 327/175, 170, 327/173, 174, 179, 231, 291; 330/301

(56) References Cited

U.S. PATENT DOCUMENTS

| | | | | |
|---|---|---|---|---|
| 5,572,158 | A | * 11/1996 | Lee et al. | 327/175 |
| 5,907,254 | A | 5/1999 | Chang | 327/165 |
| 6,107,887 | A | * 8/2000 | Zucker et al. | 330/301 |
| 6,169,434 | B1 | * 1/2001 | Portmann | 327/175 |
| 6,169,765 | B1 | 1/2001 | Holcombe | 375/238 |
| 6,181,178 | B1 | * 1/2001 | Choi | 327/175 |
| 6,404,281 | B1 | * 6/2002 | Kobayashi | 330/85 |

2002/0140477 A1 * 10/2002 Zhou et al. ............... 327/175

FOREIGN PATENT DOCUMENTS

EP  0377897  12/1988 ............ H03K/5/08

OTHER PUBLICATIONS

Behzad Razavi, "A 2.5–Gb/s 15–mW Clock Recovery Circuit", IEEE Journal of Solid-State Circuits, vol. 31, No. 4, Apr. 1996, pp. 472–480.

* cited by examiner

Primary Examiner—Timothy P. Callahan
Assistant Examiner—Linh Nguyen
(74) Attorney, Agent, or Firm—Philip Wadsworth; Charles Brown; Donald Kordich

(57) ABSTRACT

A method of performing duty cycle correction of an input signal having a non-uniform duty cycle is provided. A signal representative of the difference in duration between the positive and negative portions of the input signal duty cycle is formed. A switching level is derived from the signal. An output signal is then formed through a switching action, whereby durations of positive and negative portions of the output signal duty cycle are defined by crossover points between the input signal and the switching level. The signal (and switching level) are adjusted, if necessary, until the output signal duty cycle is at least substantially uniform.

1 Claim, 11 Drawing Sheets

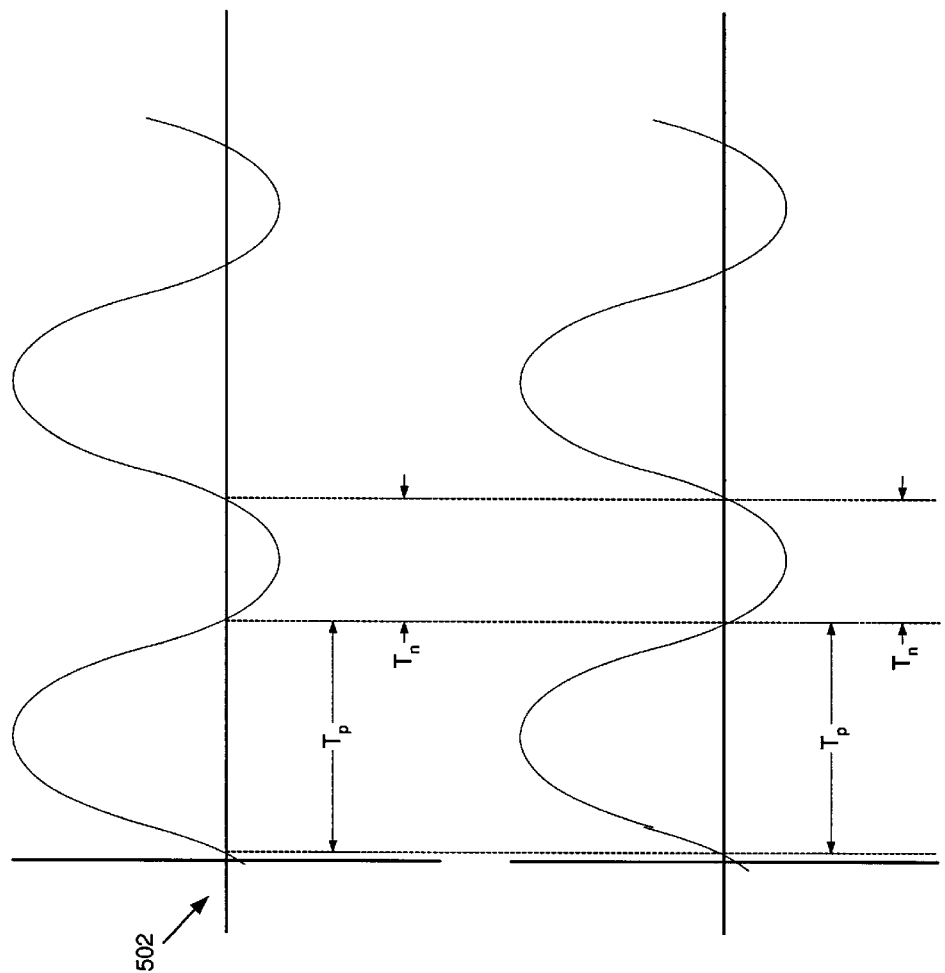

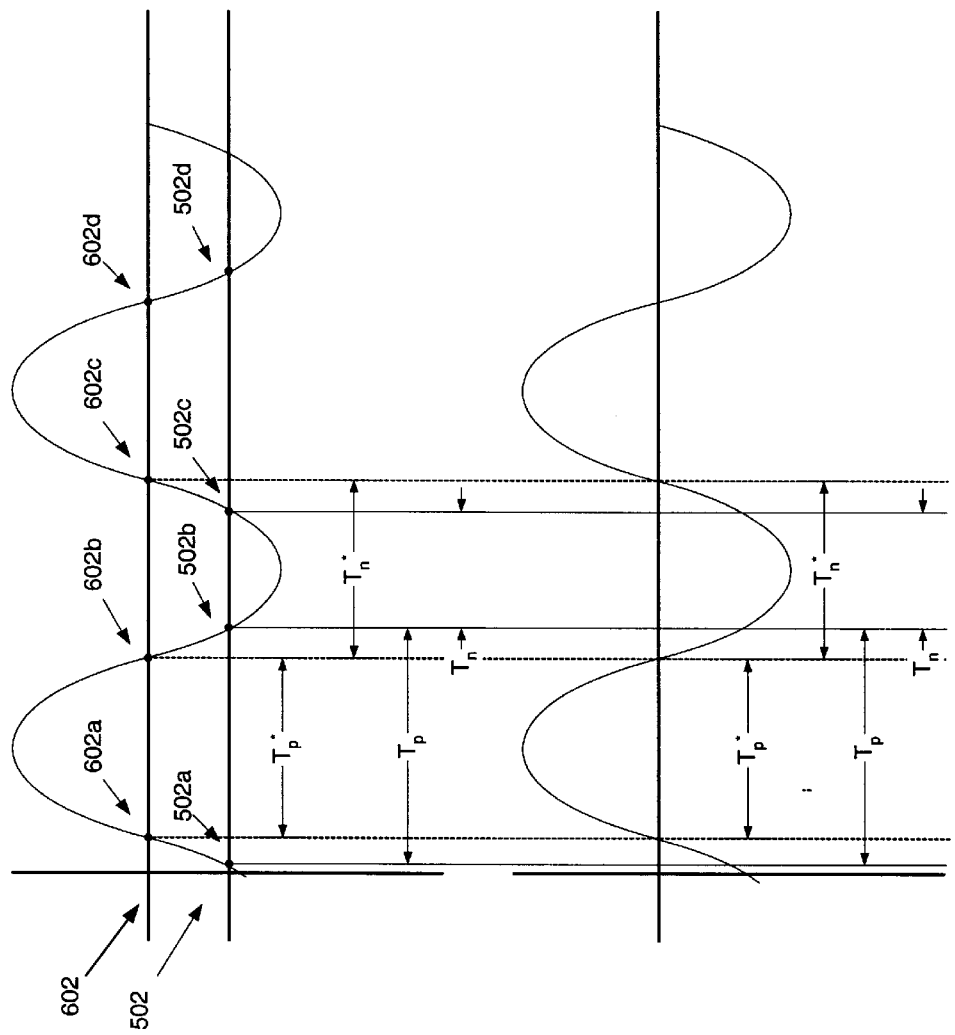

METHOD OF PERFORMING DUTY CYCLE CORRECTION

FIELD OF THE INVENTION

This invention relates to the fields of duty cycle correction and differential pair circuits, and, more specifically, to methods of performing duty cycle correction, including but not limited to methods of performing duty cycle correction using differential pair circuits.

RELATED ART

Many non-linear systems introduce into a sinusoidal signal non-linearities in the form of high frequency harmonics, each at an integer multiple of the fundamental frequency. The harmonics may be odd harmonics, i.e., harmonics the frequency of which is an odd integer multiple of the fundamental frequency, even harmonics, i.e, harmonics the frequency of which is an even integer multiple of the fundamental frequency, or both.

The introduction of even harmonics to sinusoidal signals is problematic in differential or balanced applications where it is desired to maintain odd symmetry. The reason is the non-uniform group delay, i.e., a delay which varies with frequency, typically exhibited by many transmission media delays higher frequency components of a signal more than the fundamental frequency. Because of this non-uniform group delay, transmission of the signal through the media delays the even harmonics in the sinusoidal signal more than the fundamental frequency, thus destroying the odd symmetry exhibited by the signal.

Consider, for example, a sinusoidal signal at a particular fundamental frequency. Such a signal exhibits odd symmetry only if it has a uniform (about 50%) duty cycle, i.e., a duty cycle in which the portion of the period T during which the signal is positive is about equal to the portion of the period T the signal is negative. If even harmonics are introduced into such a signal, and the signal then transmitted over a transmission media with a non-constant group delay, the duty cycle of the resultant signal will no longer be uniform, i.e., at about 50%. Consequently, the signal will no longer be suitable for differential or balanced applications where odd symmetry and a uniform duty cycle are required.

Consider, for example, the signal $x_y=1.2\sin(2\pi t_y)$, identified with numeral 100 in FIG. 1. The signal $z_y=\sin(2t_y)+0.2\sin(4t_y+\pi/2)$, identified in FIG. 1 with numeral 102, is representative of the signal $x_y$ to which has been added a second order harmonic with a phase shift of $\pi/2$. In addition, the signal $zz_y=\sin(2\pi t_y)+0.2\sin(4\pi t_y+/4)$, identified in FIG. 1 with numeral 104, is representative of the signal $x_y$ to which has been added a second order harmonic with a phase shift of $\pi/4$. Both the signals $z_y$ and $zz_y$ are representative of the signals that might result from introducing even harmonics into the signal $x_y$, and then passing the resultant signal through a transmission medium with a non-uniform group delay. While the signal $x_y$ has a 50% duty cycle, it will be observed that both the signals $z_y$ and $zz_y$ have non-uniform duty cycles, i.e., signals at other that a 50% duty cycle. This can be seen most readily by comparing the zero-crossing for the signal $x_y$, identified with numeral 106, with that for the signals $z_y$ and $zz_y$, identified with numeral 108, and observing that the latter zero crossings occur later in time that the former zero crossing, which occurs at $t_y=0.5$.

As another example, consider again the signal $x_y=1.2\sin(2t_y)$, identified with numeral 100 in FIG. 2. The signal $z_y=\sin(2\pi t_y)+0.2\sin(8\pi t_y+\pi/2)$, identified in FIG. 2 with numeral 202, is representative of the signal $x_y$ to which has been added a fourth order harmonic with a phase shift of $\pi/2$. In addition, the signal $zz_y=\sin(2\pi t_y)+0.2\sin(8\pi t_y+\pi/4)$, identified in FIG. 2 with numeral 204, is representative of the signal $x_y$ to which has been added a fourth order harmonic with a phase shift of $\pi/4$. Again, both the signals $z_y$ and $zz_y$ are representative of the signals that might result from introducing even harmonics into the signal $x_y$, and then passing the resultant signal through a transmission medium with a non-uniform group delay. While the signal $x_y$ has a 50% duty cycle, it will be observed that both the signals $z_y$ and $zz_y$ have non-uniform duty cycles. This can be seen most readily by comparing the zero-crossing for the signal $x_y$, identified with numeral 106, with that for the signals $z_y$ and $zz_y$, identified with numeral 208, and observing that the latter zero crossings occur later in time that the former zero crossing, which occur at $t_y=0.5$.

Other mechanisms exist for producing signals with non-uniform duty cycles when signals with uniform duty cycles are desired. Thus, what is needed is a method for performing duty cycle correction for signals having non-uniform duty cycles.

SUMMARY OF THE INVENTION

The invention provides a method of performing duty cycle correction of an input signal having a non-uniform duty cycle.

In this method, a signal is formed which is representative of the difference in duration between the positive and negative portions of the input signal duty cycle. A switching level is then derived from the signal. An output signal is formed through a switching action, whereby durations of positive and negative portions of the output signal duty cycle are defined by crossover points between the input signal and the switching level. The signal (and switching level) are then adjusted, if necessary, until the output signal duty cycle is substantially uniform.

In one embodiment, the signal representative of the difference in duration between the positive and negative portions of the input signal duty cycle is a DC voltage formed across one or more capacitors in a capacitor-degenerating differential pair circuit. A DC switching level is derived from the DC voltage. The output signal in this embodiment is formed through the switching actions of the differential pair circuit, whereby the durations of positive and negative portions of the output signal duty cycle are defined by crossover points between the input signal and the DC switching level. The DC voltage across the one or more capacitors (and the DC switching level) are automatically adjusted, if necessary, until the output signal duty cycle is at least substantially uniform.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 5A illustrates an example of an input signal having a non-uniform duty cycle, and FIG. 5B illustrates the resultant output signal prior to adjustment of the switching level to substantially equalize the durations of the positive and negative portions of the output signal duty cycle.

FIG. 6A illustrates an example of an input signal having a non-uniform duty cycle, and FIG. 6B illustrates the resultant output signal after adjustment of the switching level to substantially equalize the durations of the positive and negative portions of the output signal duty cycle.

DETAILED DESCRIPTION

As utilized herein, terms such as "about" and "substantially" are intended to allow some leeway in mathematical exactness to account for tolerances that are acceptable in the trade, e.g., any deviation upward or downward from the value modified by "about" or "substantially" by any value in the range(s) from 1% to 20% of such value.

Figure 1:
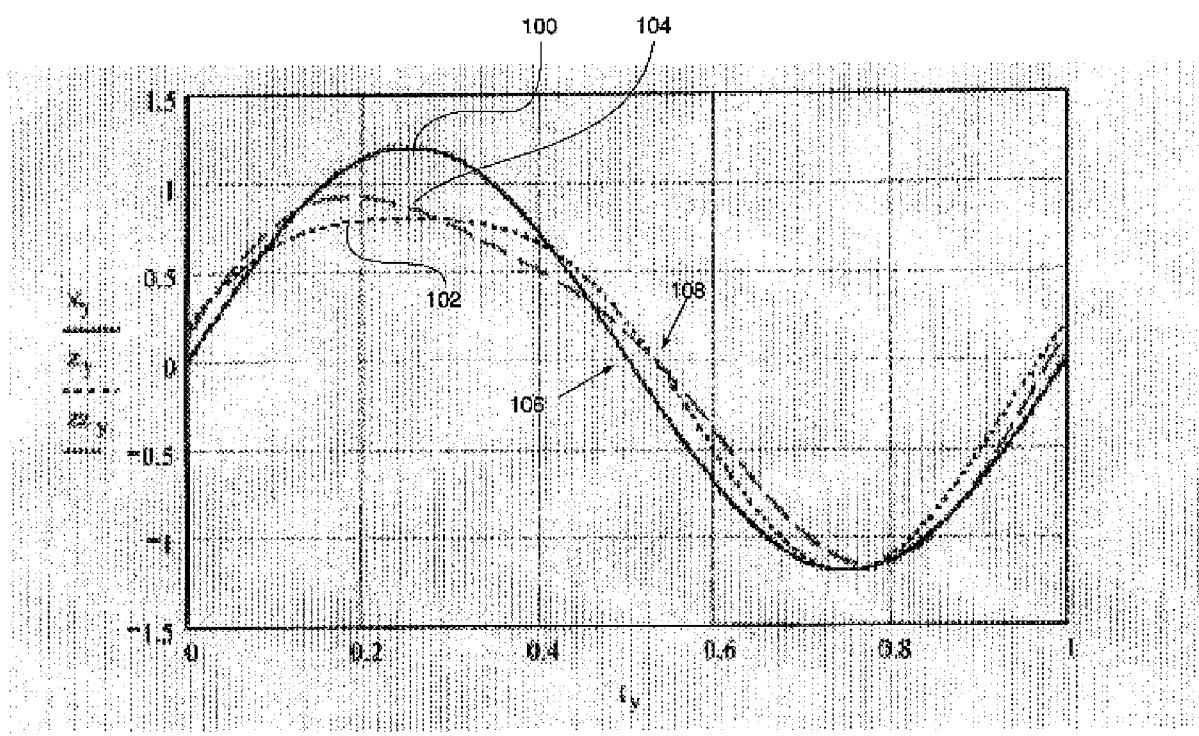
FIGS. 1 and 2 are examples illustrating how the addition to a sinusoidal signal having a uniform duty cycle of a delayed even harmonic introduces a non-uniform duty cycle.
Figure 2:
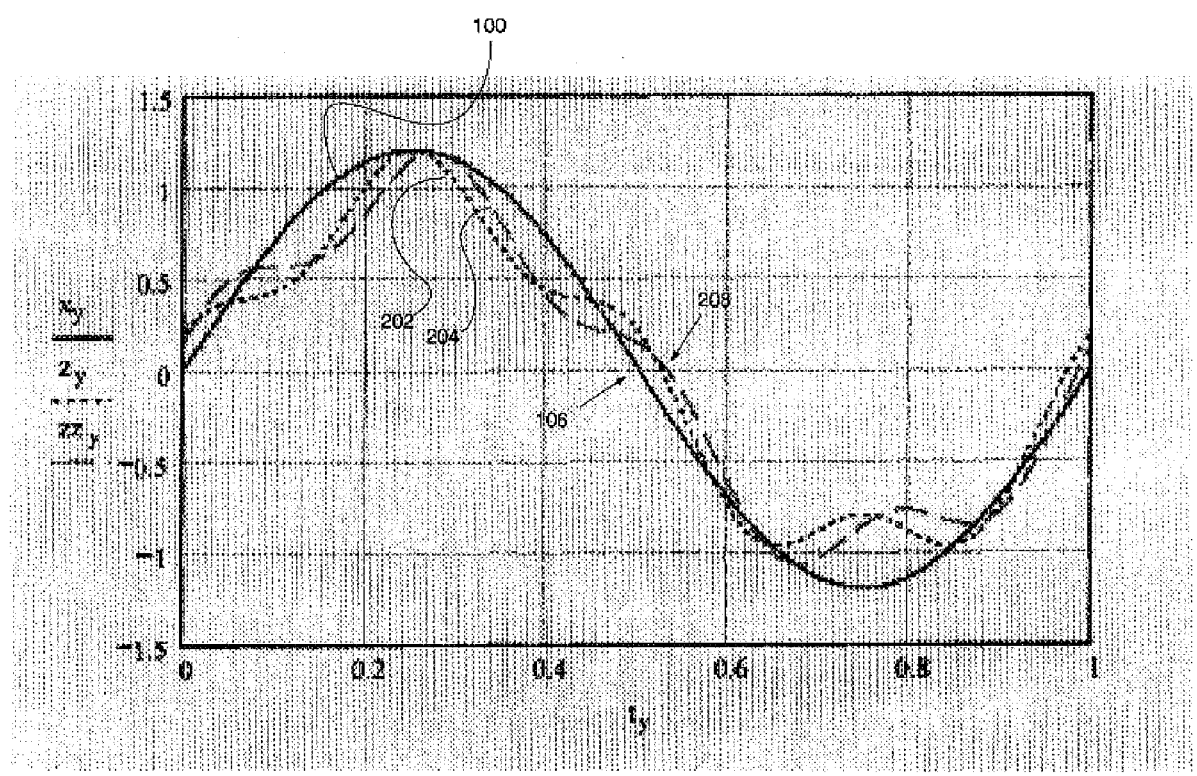
Figure 3:
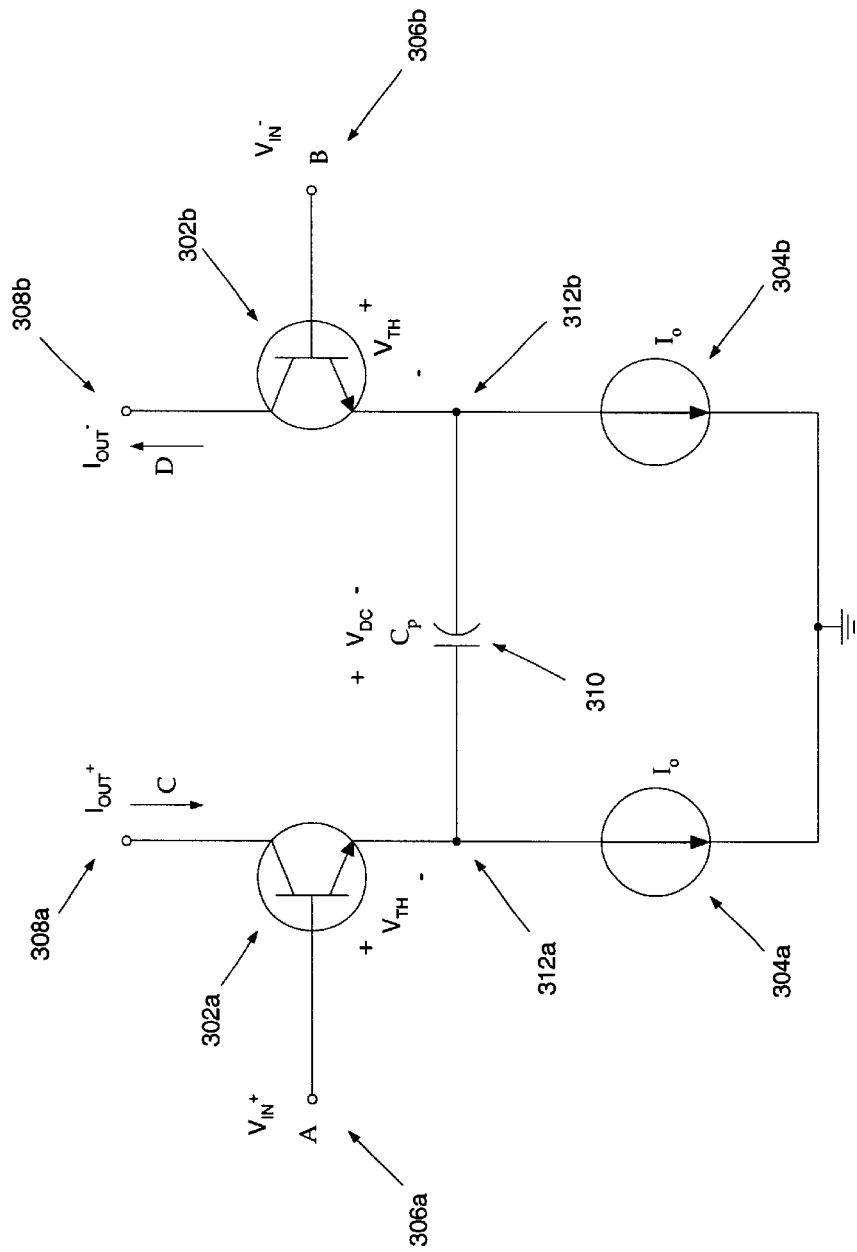
FIG. 3 illustrates a core portion of a bipolar implementation of a capacitor-degenerating differential pair circuit.

Referring to FIG. 3, an implementation of the core portion of a capacitor-degenerating differential pair circuit is illustrated. In this particular implementation, the circuit comprises a differential pair of NPN transistors, identified with numerals $302a$ and $302a$, with a capacitor $310$ coupled between the emitters of the two transistors. Each of the emitters is coupled to a current source, identified respectively with numerals $304a$ and $304b$, which in turn is coupled to ground. Each of the current sources $304a$ and $304b$ source a current $I_o$. A voltage-mode differential input signal, $V_{IN}^+$ and $V_{IN}^-$, is input to the bases of the two transistors, identified respectively with numerals $306a$ and $306b$ (and with the labels 'A' and 'B'). In addition, a differential current mode output signal, $I_{OUT}^+$ and $I_{OUT}^-$, is produced on terminals $308a$ and $308b$ (identified respectively with labels 'C' and 'D').

While this particular implementation involves the use of bipolar NPN transistors, a differential voltage mode input signal, a differential current mode output signal, and a single capacitor between the emitters of the two transistors, it should be appreciated that the invention is not so limited and that embodiments of a capacitor degenerating differential pair circuit are possible for use in connection with the invention which involve the use of technologies other than bipolar, including but not limited to FET, MOS, or CMOS technology, that involve the use of PNP bipolar, FET, MOS, or CMOS transistors, that involves a single ended input signal or an input signal which is current mode rather than voltage mode, that involves a single ended output signal or an output signal which is voltage mode rather than current mode, or that involves more than one capacitor coupled between the emitters (or drains) of the differential pair of transistors.

When a periodic signal having a non-uniform duty cycle is input to the circuit at input terminals $306a$ and $306b$, a DC voltage, $V_{DC}$, forms across the capacitor $310$ in the circuit, which is representative of the difference in duration between the positive and negative portions of the input signal duty cycle.

To see this, observe that the circuit is configured to switch between two modes of operation. In the first mode, the transistor $302a$ is turned on, and the transistor $302a$ is turned off. This mode occurs during the positive portion of the input signal duty cycle, when the amplitude of the input signal at terminal $306a$, $V_{IN}^+$, exceeds a switching level, equal to the sum of the threshold base to emitter voltage across the base to emitter junction of transistor $302a$, $V_{TH}$, and the voltage at node $312a$, and the amplitude of the input signal at terminal $306b$, $V_{IN}^-$, is less than a switching level equal to the sum of the threshold base to emitter voltage across the base to emitter junction of transistor $302a$, $V_{TH}$, plus the voltage at node $312a$.

Figure 4A:
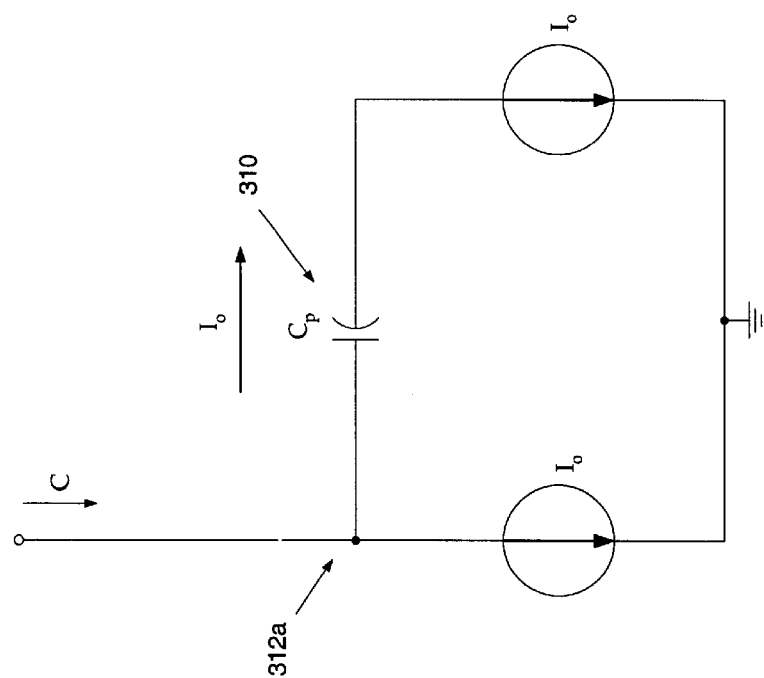
FIG. 4A illustrates the operative portion of a capacitor-degenerating differential pair circuit during a first mode of operation when the input signal is above a switching level.

During this mode of operation, the circuit may be represented as shown in FIG. 4A. As shown, due to application of Kirchoff's current law at node $312a$, a current $I_o$ flows through the capacitor $310$ in the direction shown and charges it.

In the second mode of operation, transistor $302a$ is turned off, and transistor $302a$ is turned on. This mode occurs during the negative portion of the input signal duty cycle, when the amplitude of the input signal at terminal $306a$, $V_{IN}^+$, is less than a switching level equal to the sum of the threshold base to emitter voltage across the base to emitter junction of transistor $302a$, $V_{TH}$, and the voltage at node $312a$, $V_{312a}$, and the amplitude of the input signal at terminal $306b$, $V_{IN}^-$, is greater than a switching level equal to the sum of the threshold voltage across the base to emitter junction of transistor $302b$, $V_{TH}$, and the voltage at node $312b$, $V_{312b}$.

Figure 4B:
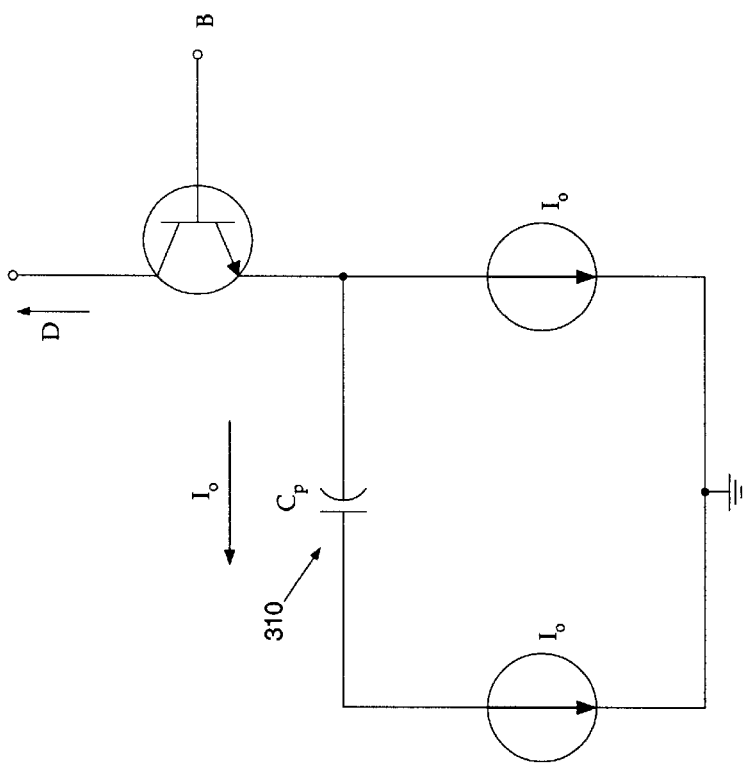
FIG. 4B illustrates the operative portion of a capacitor-degenerating differential pair circuit during a second mode of operation when the input signal is below the switching level.

During this mode of operation, the circuit may be represented as shown in FIG. 4B. As shown, the current $I_o$ flows through capacitor $310$ in the reverse direction and discharges it.

The charge q that will remain on the capacitor $310$ upon the conclusion of the positive and negative portions of the input signal duty cycle can be expressed as $I_o \cdot (T_p - T_n)$, where $T_p$ is the duration of the positive portion of the input signal duty cycle, and $T_n$ is the duration of the negative portion of the input signal duty cycle. The DC voltage that forms across the capacitor, $V_{DC}$, can be expressed as $I_o \cdot (T_p - T_n)/C_p$. It can be seen that this voltage is representative of the difference in duration between the positive and negative portions of the input signal duty cycle, $T_p - T_n$.

The DC voltage which forms across capacitor $310$ modifies the switching action which occurs in the differential pair circuit so that the duty cycle of the output signal is substantially uniform.

To see this, observe that, prior to the formation of the DC voltage across the capacitor $310$, an output signal is formed having a duty cycle which matches that of the input signal. Referring to FIG. 5A, for example, a single-ended input signal is shown having a non-uniform duty cycle where the positive portion of the duty cycle, $T_p$, exceeds the negative portion of the duty cycle, $T_n$. FIG. 5B illustrates the resultant output signal. As shown, the output signal also has a non-form duty cycle which matches that of the input signal.

In particular, akin to the input signal, the positive portion of the output signal duty cycle, $T_p$, exceeds the negative portion of the output signal duty cycle, $T_n$.

Once the DC voltage has formed across the capacitor 310, referring to FIG. 6A, the switching level for the input signal increases from the level identified with numeral 502 to the level identified by numeral 602, due to the DC voltage which forms across capacitor 310. Due to the change in the switching level of the input signal, the crossover points between the input signal and the switching level change from 502a, 502b, 502c, and 502d to 602a, 602b, 602c, and 602d. Consequently, the duration of the positive portion of the input signal duty cycle decreases from $T_p$ to $T_p^*$, and the duration of the negative portion of the input signal duty cycle increases from $T_n$ to $T_n^*$.

Referring to FIG. 6B, the duration of the positive portion of the duty cycle of the resultant output signal which is formed, which is defined by the difference between successive crossover points between the input signal and the switching level, has also changed to $T_p^*$. Similarly, the duration of the negative portion of the duty cycle of the resultant output signal which is formed, which is also defined by the difference between successive crossover points between the input signal and the switching level, has also changed to $T_n^*$. If $T_p^*$ is not equal to $T_n^*$, the DC voltage across the capacitor 310 will automatically adjust until the two are about equal. For example, if $T_p^*$ exceeds $T_n^*$, the DC voltage across the capacitor 310 will increase, causing the switching level to increase until $T_p^*$ about equals $T_n^*$. Similarly, if $T_p^*$ is less than $T_n^*$, the DC voltage across the capacitor 310 will decrease, causing the switching level to decrease until $T_p^*$ about equals $T_n^*$. In either case, since $T_p^*$ about equals to $T_n^*$, the output signal has a uniform duty cycle.

FIGS. 7A–7F illustrate some of the alternate embodiments of the core circuit of FIG. 3 which are possible. Other embodiments are possible so these embodiments should not be construed as limiting.

Figure 7A:
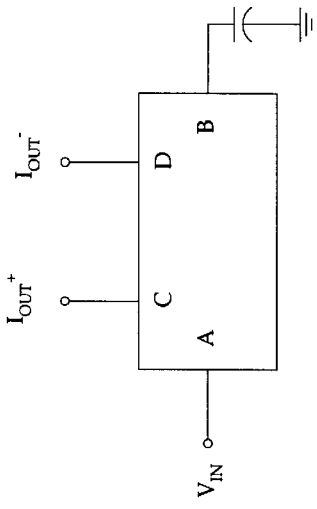
FIGS. 7A–7F illustrate alternate embodiments of a capacitor-degenerating differential pair circuit.
Figure 7B:
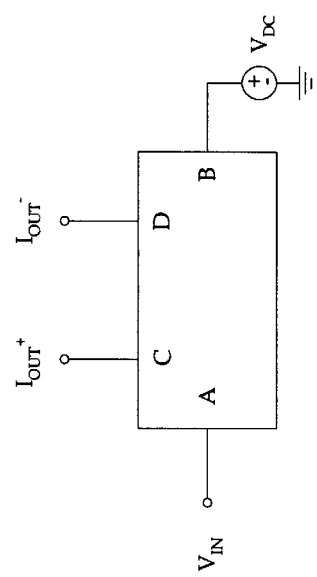

FIGS. 7A and 7B illustrate embodiments where the input signal, $V_{IN}$, is a single-ended voltage mode signal, and the output signal is a differential current mode signal identified as $I_{OUT}^+$ and $I_{OUT}^-$.

Figure 7C:
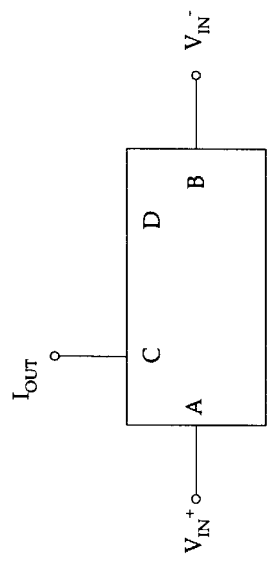

FIG. 7C illustrates an embodiment in which the input signal is a differential voltage mode signal identified as $V_{IN}^+$ and $V_{IN}^-$, and the output signal is a differential voltage mode signal identified as $V_{OUT}^+$ and $V_{OUT}^-$.

Figure 7D:
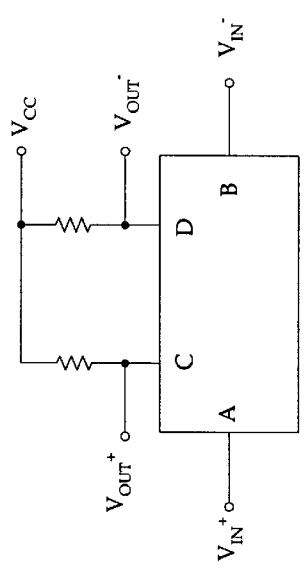

FIG. 7D illustrates an embodiment in which the input signal is a differential voltage mode signal identified as $V_{IN}^+$ and $V_{IN}^-$, and the output signal is a single ended current mode signal identified as $I_{OUT}$.

Figure 7F:
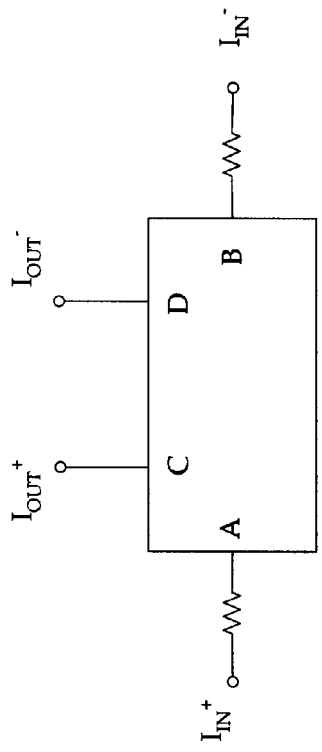
Figure 7E:
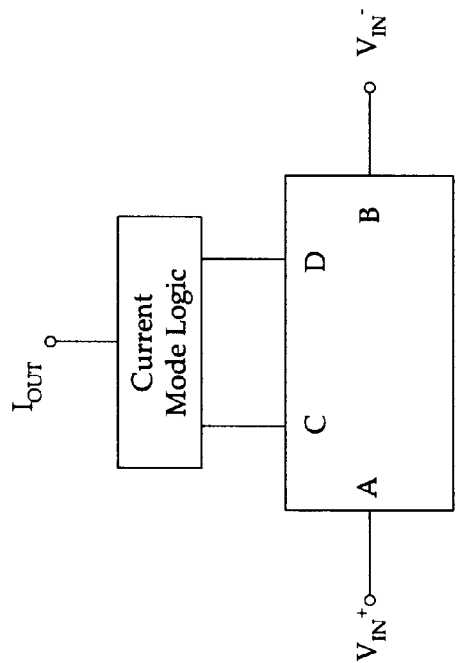

FIG. 7E illustrates an embodiment in which the input signal is a differential voltage mode signal identified as $V_{IN}^+$ and $V_{IN}^-$, and the output signal is fed into a current mode logic section.

FIG. 7F illustrates an embodiment in which the input signal is a differential current mode signal identified as $I_{IN}^+$ and $I_{IN}^-$, and the output signal is a differential current mode signal identified as $I_{OUT}^+$ and $I_{OUT}^-$.

In one implementation example of the circuit illustrated in FIG. 3, transistors 302a and 302a are matched bipolar NPN transistors each having the following physical parameters: emitter length=3 microns, emitter width=0.4 microns, and number of emitters=6. Capacitor 310 in this example comprises four capacitors placed in parallel and having a combined capacitance of 1.0 pF. Each such capacitor has the following physical parameters: length=10.4 microns, and width=60.1 microns.

Figure 8:
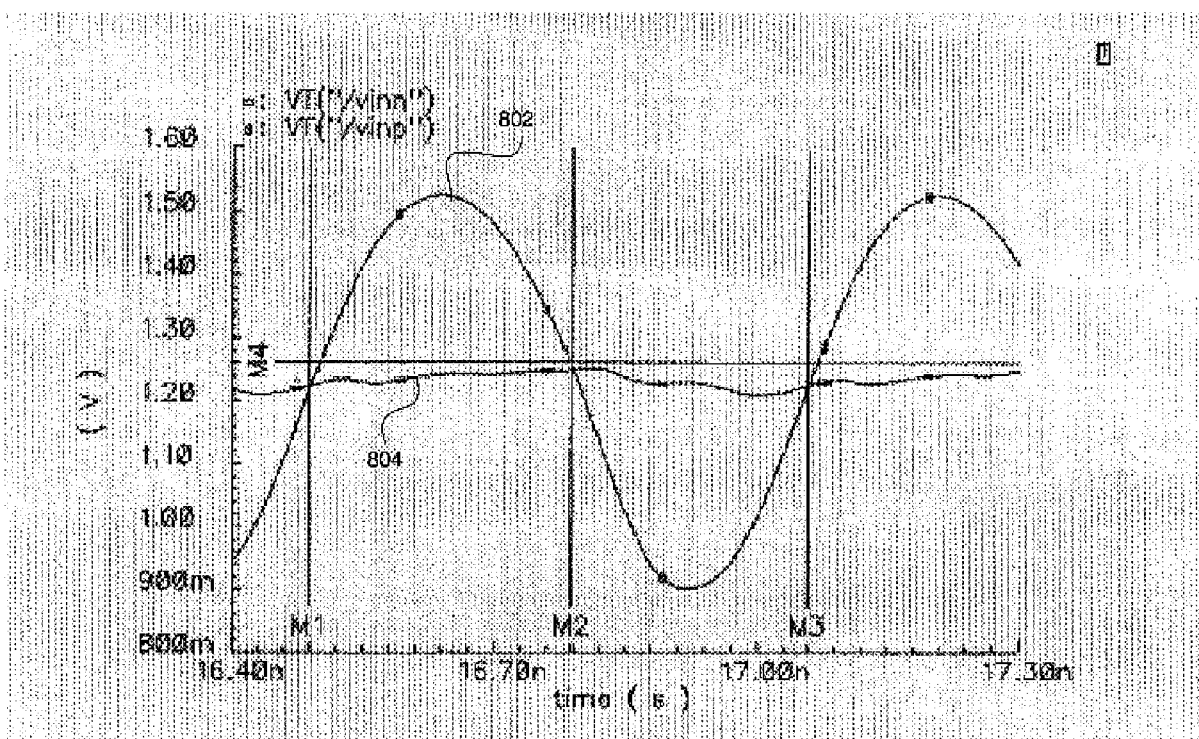
FIG. 8 illustrates an example in which an increase in the switching level of a capacitor-degenerating differential pair circuit achieves a substantially uniform output signal duty cycle.

FIG. 8 illustrates the operation of this implementation example in correcting the duty cycle of an input signal 802 having a non-uniform duty cycle with respect to the unadjusted switching level 804. As illustrated, the duration of the positive portion of the duty cycle, represented by the horizontal distance between the markers M1 and M2, exceeds the duration of the negative portion of the duty cycle, represented by the horizontal distance between the markers M2 and M3. Due to operation of the circuit, the switching level is adjusted to the level identified with the marker M4. Relative to this adjusted switching level, the duty cycle of the input cycle is substantially uniform. This in turn causes the duty cycle of the output signal to be substantially uniform.

Figure 9:
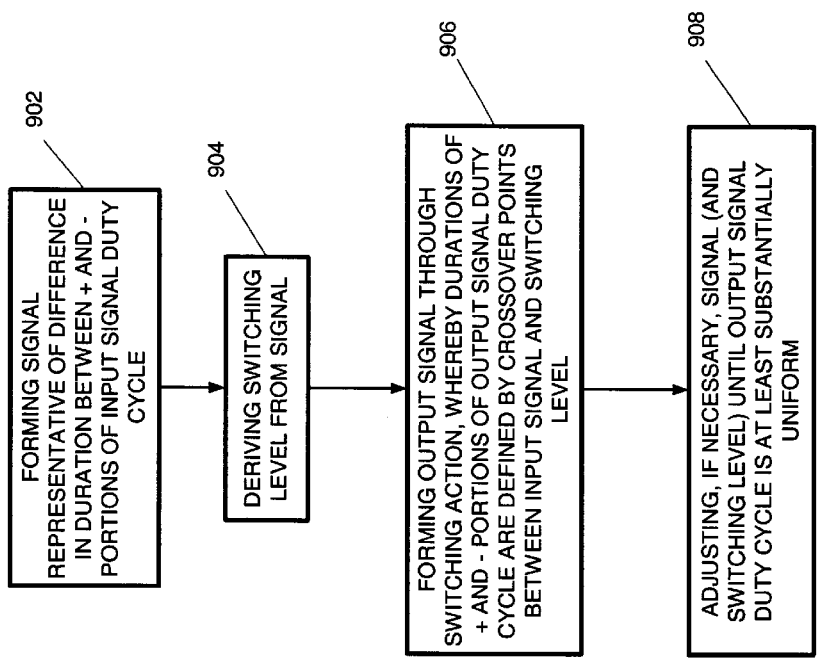
FIG. 9 is a flowchart illustrating an embodiment of a method of performing duty cycle correction of an input signal having a non-uniform duty cycle.

Referring to FIG. 9, an embodiment of a method of performing duty cycle correction of an input signal having a non-uniform duty cycle is illustrated. The input signal may be a differential or single ended signal, and it may also be a current mode or voltage mode signal.

The method begins with step 902, which comprises forming a signal representative of the difference in duration between the positive portion of the input signal duty cycle and the negative portion of the input signal duty cycle. In one implementation, this signal is a DC voltage formed across one or more capacitors in a capacitor-degenerating differential pair circuit.

From step 902, the method proceeds to step 904, which comprises deriving a switching level from the signal resulting from step 902.

From step 904, the method proceeds to step 906, which comprises forming an output signal having a duty cycle, whereby durations of positive and negative portions of the output signal duty cycle are defined by crossover points between the input signal and the switching level resulting from step 904. The output signal may be differential or single-ended signal, and it may also be a current mode or a voltage mode signal. In one implementation example, the output signal is formed through the switching action of a capacitor-degenerating differential pair circuit.

From step 906, the method proceeds to step 908, which comprises adjusting, if necessary, the signal (and the resultant switching level) until the duty cycle of the output signal is uniform or at least substantially uniform. (In this embodiment, it is assumed that a switching level is possible which substantially equalizes the positive and negative portions of the output signal duty cycle.)

In "A 2.5-Gb/s 15-mW Clock Recovery Circuit," Behzad Razavi, IEEE Journal of Solid-State Circuits, Vol. 31, No. 4, Apr. 1996, pp. 472–480, a capacitor-degenerating differential pair circuit is illustrated (see FIG. 9(a)) and described for use in a particular application, i.e., clock recovery. However, this reference does not teach, describe or suggest the use of a capacitor-degenerating differential pair circuit for performing duty cycle correction.

While various embodiments of the invention have been described, it will be apparent to those of ordinary skill in the art that many more embodiments and implementations are possible that are within the scope of this invention.

What is claimed is:

1. A method of performing duty cycle correction of an input signal having a non-uniform duty cycle using a capacitor-degenerating differential pair circuit comprising:

a step for inputting to the circuit the input signal having the non-uniform duty cycle;

a step for forming a DC voltage across one or more capacitors in the circuit which is representative of the difference in duration between positive and negative portions of the input signal duty cycle;

a step for deriving a DC switching level from the DC voltage;

a step for forming, through a switching action of the differential pair circuit, an output signal having a duty cycle, whereby durations of positive and negative portions of the output signal duty cycle are defined by crossover points between the input signal and the DC switching level;

a step for adjusting the DC voltage until the output signal duty cycle is at least substantially uniform;

wherein the capacitor-degenerating differential pair circuit comprises one or more capacitors coupled between the emitters of a differential pair of bipolar transistors.

* * * * *